United States Patent [19]
Watanabe et al.

[11] Patent Number: 5,400,372
[45] Date of Patent: Mar. 21, 1995

[54] PHASE-LOCKED LOOP HAVING CHARGE PUMP DRIVEN WITH PRESERVED ENERGY FOR INSTANT CHANNEL SWITCHING

[75] Inventors: Nozomu Watanabe, Tokyo; Atsushi Inahashi, Saitama, both of Japan

[73] Assignee: NEC Corporation, Tokyo, Japan

[21] Appl. No.: 898,828

[22] Filed: Jun. 15, 1992

[30] Foreign Application Priority Data

Jun. 13, 1991 [JP] Japan .................................. 3-142005

[51] Int. Cl.$^6$ ........................... H03D 3/24; H03L 7/00
[52] U.S. Cl. ....................................... 375/376; 331/25
[58] Field of Search .................. 375/81, 120; 455/183, 455/260; 331/8, 17, 25, 14

[56] References Cited

U.S. PATENT DOCUMENTS 4,611,239  9/1986  Shanley, II ............................ 358/19
5,151,665  9/1992  Wentzler ................................ 331/8

*Primary Examiner*—Stephen Chin
*Attorney, Agent, or Firm*—Sughrue, Mion, Zinn, Macpeak & Seas

[57] ABSTRACT

A frequency synthesizer comprises a voltage controlled oscillator, and a variable frequency divider for dividing the VCO frequency according to the frequency of a communication channel. The output of frequency divider is compared with a reference frequency and a phase difference of first polarity and a phase difference of second polarity are detected. A charge-control voltage is generated with a duration variable with the phase difference of first polarity and a discharge-control voltage with a duration variable with the phase difference of second polarity. First and second integrators are coupled respectively to outputs of the phase comparator for respectively smoothing waveforms of the control voltages. Energy is injected into a charge pump in response to the smoothed charge-control voltage and drained from it in response to the smoothed discharge-control voltage to produce a frequency control signal for coupling to the VCO. To achieve instant switching between adjacent channels, a differentiator is coupled across the outputs of the phase comparator for preserving part of energy to be supplied to or drained from the charge pump until sufficient energy is stored.

2 Claims, 4 Drawing Sheets

PHASE-LOCKED LOOP HAVING CHARGE PUMP DRIVEN WITH PRESERVED ENERGY FOR INSTANT CHANNEL SWITCHING

BACKGROUND OF THE INVENTION

The present invention relates generally to frequency synthesizers, and more particularly to a phase-locked loop frequency synthesizer which can be switched to any of a group of communication channels.

A PLL frequency synthesizer having a charge pump is known. If this type of synthesizer is used for communication channels, and a switching occurs between channels, the synthesizer needs a long period of time to lock its frequency with the new channel. This occurs when the frequencies of these channels are close to each other.

SUMMARY OF THE INVENTION

It is therefore an object of the present invention to provide a PLL frequency synthesizer which ensures instant switching of communication channels between which a small frequency difference exists.

The present invention is based on the discovery that a substantial amount of energy is wasted by the charge pump of the synthesizer at each of pulse-by-pulse phase comparisons between reference and controlled VCO (voltage controlled oscillator) frequencies.

According to the present invention, the frequency synthesizer comprises a voltage controlled oscillator, a variable frequency divider for dividing the VCO frequency according to the frequency of a communication channel. A phase comparator provides comparison between the output of frequency divider and a reference frequency and detects a phase difference of first polarity and a phase difference of second polarity, and produces a charge-control voltage with a duration variable with the phase difference of first polarity and a discharge-control voltage with a duration variable with the phase difference of second polarity. First and second integrators are coupled respectively to outputs of the phase comparator for respectively smoothing waveforms of the charge-control voltage and the discharge-control voltage. A charge pump is arranged to be charged in response to the smoothed waveform of the charge-control voltage and discharged in response to the smoothed waveform of the discharge-control voltage to produce a frequency control signal with which the voltage controlled oscillator is controlled. To achieve instant switching between adjacent channels, differentiator is coupled across the outputs of the phase comparator for absorbing part of the energy of the charge-control signal applied to the first integrator and absorbing part of the energy of the discharge-control signal applied to the second integrator.

BRIEF DESCRIPTION OF THE DRAWINGS

The present invention will be described in further detail with reference to the accompanying drawings, in which.

DETAILED DESCRIPTION

Figure 1:
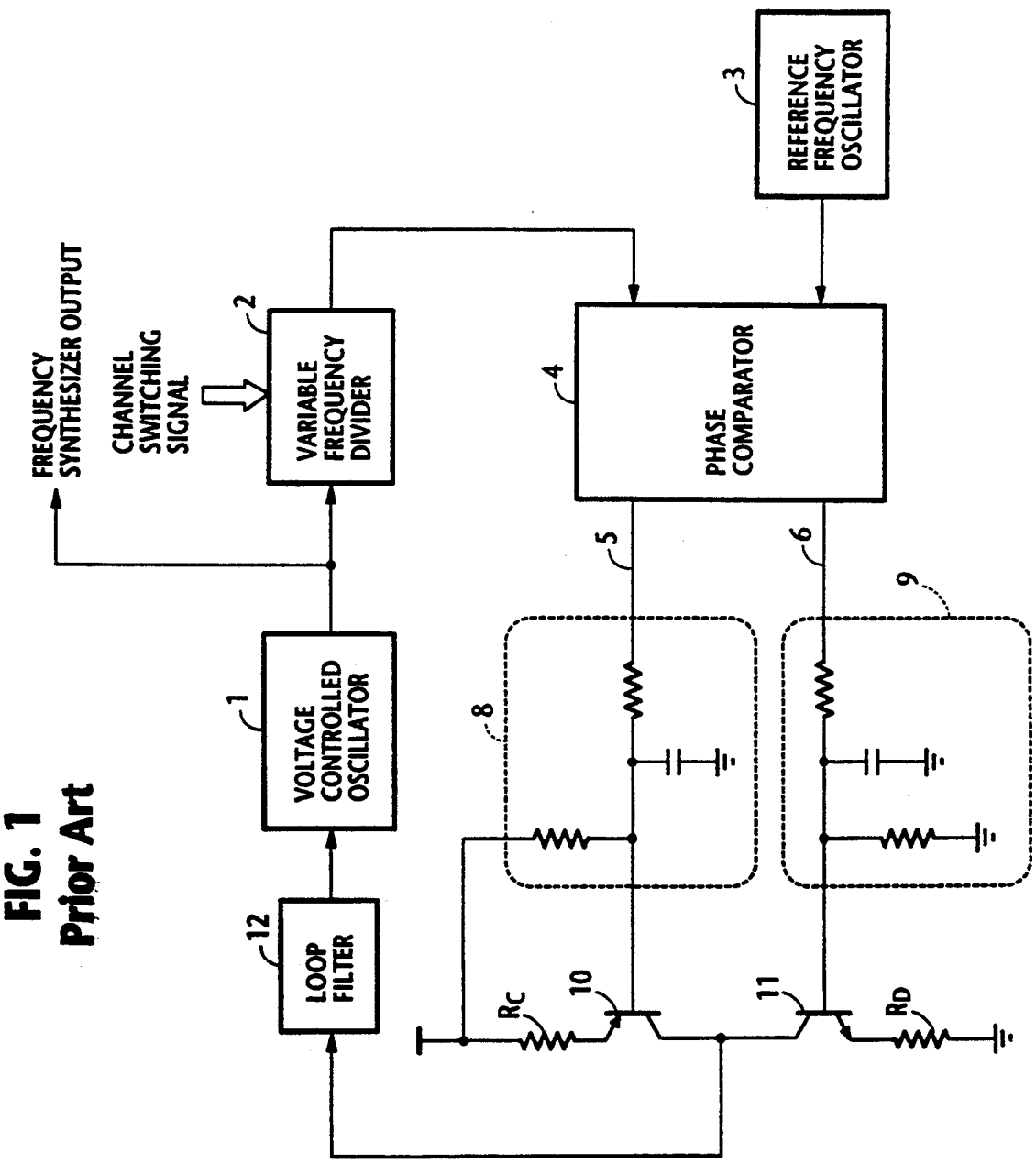
FIG. 1 is a circuit diagram of a prior art phase-locked loop frequency synthesizer.

Before going into the detail of the present invention, it is appropriate to describe the prior art phase-locked loop frequency synthesizer in detail with reference to FIG. 1. The prior art PLL includes a voltage-controlled oscillator 1 to produce a synthesized frequency output. The frequency of the VCO is divided by a variable frequency divider 2 to which channel switching signal is applied to change its dividing ratio according to the frequency of a channel to which the frequency synthesizer is to be tuned. The output of frequency divider 2 is an input to a phase comparator 4 to which a reference frequency is supplied from a reference frequency oscillator 3. According to the phase difference between the two inputs, phase comparator 4 generates a charge-control voltage on lead 5 and a discharge-control voltage on lead 6. After passing through integrators 8 and 9, the voltages on leads 5 and 6 are applied respectively to the bases of a charging, PNP transistor 10 and a discharging, NPN transistor 11 which are connected to form a switching circuit with a pull-up resistor $R_C$ coupled to a voltage source and a resistor $R_D$ connected to ground. The junction between the transistors is connected to a loop filter 12 to form a circuit which is known as "charge pump". The output of the charge pump drives the voltage-controlled oscillator 1 when one of the transistors is biased into a conducting state.

When the phase difference is zero, the charging control voltage is maintained high and the discharging control voltage is maintained low, so that both transistors are in a nonconductive state. When the phase of the frequency divider 2 output lags behind the reference frequency, the charge-control voltage drops to a level sufficient to render the transistor 10 conductive so that it charges the loop filter 12, resulting in a rise in the control input to VCO 1 to raise its output frequency. Conversely, when the output of divider 2 advance relative to the reference frequency, the discharge-control voltage rises to a level sufficient to allow transistor 11 to conduct so that it discharges the loop filter 12, resulting in a lower VCO frequency. The effect of the integrators 8 and 9 is to absorb high-frequency pulses (harmonics of the reference frequency) which are generated as a result of a modulation process in which the VCO control voltage is modulated with the reference frequency when the frequency divider is in phase with the reference oscillator. Otherwise, the harmonics components would interfere with adjacent channels.

Figure 2A:
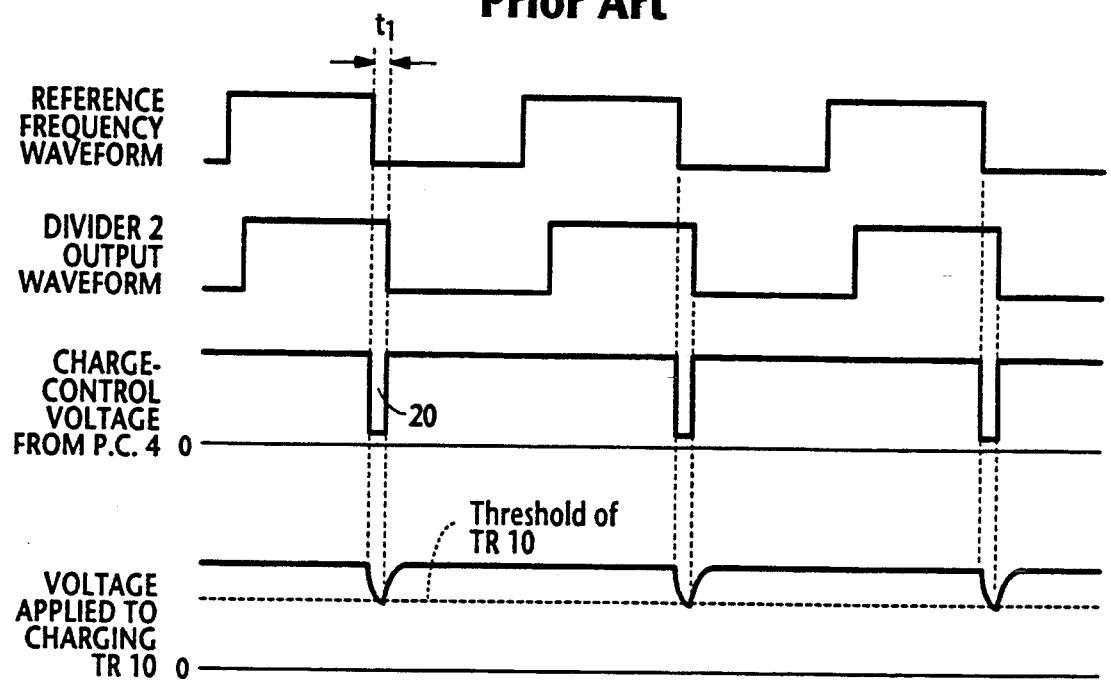
FIGS. 2A and 2B are timing diagrams associated with the prior art frequency synthesizer.

Assume that a channel switching signal is supplied to the synthesizer to cause it to be switched to a higher-frequency adjacent channel. Because of the relatively small difference in frequency between adjacent channels, a relatively small phase lag $t_1$ is likely to occur between the reference frequency and the frequency divider 2 output immediately following the channel switching as shown in FIG. 2A. The charge-control voltage on lead 5, which is normally high, drops to a low level for a duration $t_1$, producing a small duty-ratio pulse 20 which is smoothed by integrator 8. Because of the small duty ratio, most of the energy of the pulse is absorbed by integrator 8 and the output of integrator 8 stays slightly below or slightly above the threshold of the charging transistor 10. Therefore, the transistor 10 is not biased sufficiently to charge the loop filter 12 to produce an appreciable amount of phase advance. As a result, most of the charging energy is lost and the phase-locked loop takes a considerable amount of time to be pulled into a phase-locked state.

Figure 2B:
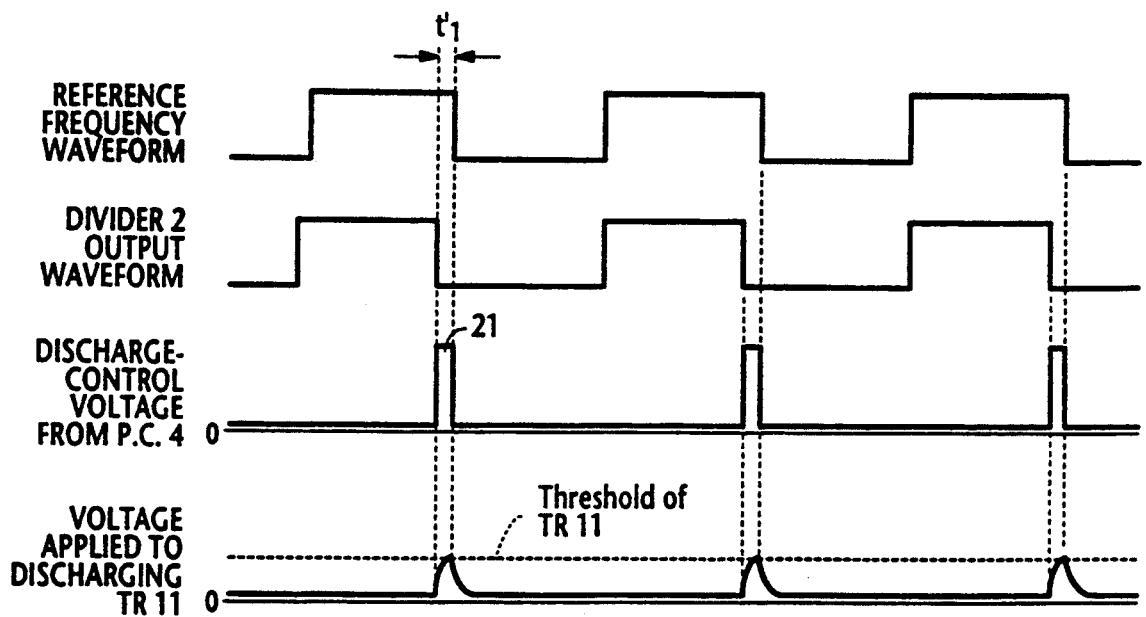

In like manner, if the synthesizer is to be switched to a lower-frequency adjacent channel, a relatively small phase advance $t'_1$ is likely to occur between the reference frequency and the frequency divider 2 output as shown in FIG. 2B, and the discharge-control voltage on lead 6, which is normally low, rises to a high level for a duration $t'_1$, producing a small duty-ratio pulse 21 which is smoothed by integrator 9. Most of the pulse energy is absorbed by integrator 9 and it stays in the neighborhood of the threshold of the discharging transistor 11. Therefore, the transistor 11 is not biased sufficiently to discharge the loop filter 12 to produce an appreciable amount of phase lag. As a result, the synthesizer takes a long time to bring it into a phase-locked state when it is switched to a channel whose frequency is close to the frequency of the previous channel.

Figure 3:
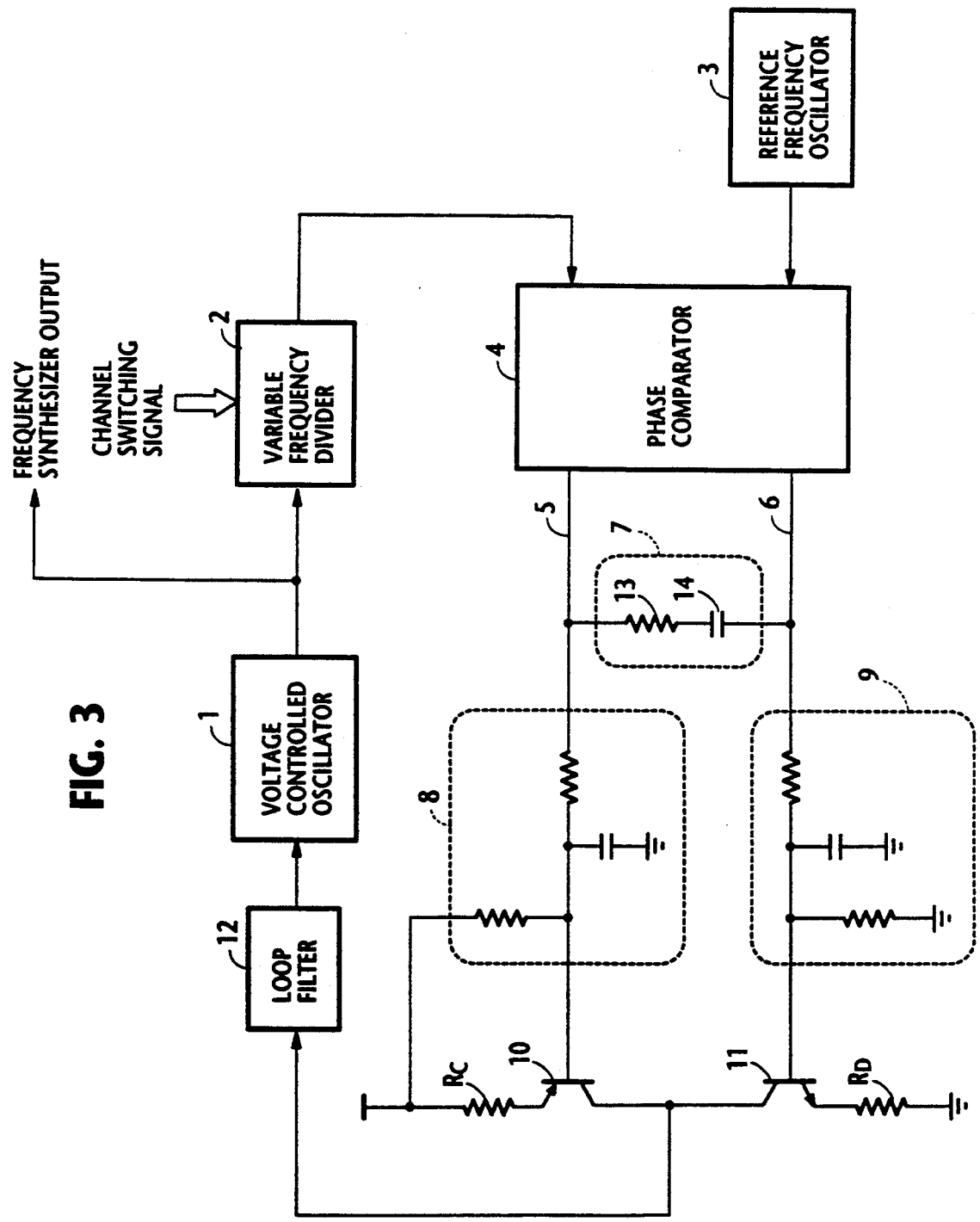
FIG. 3 circuit diagram of a phase-locked loop frequency synthesizer of the present invention.

Referring to FIG. 3, a frequency synthesizer of the present invention is illustrated. The inventive frequency synthesizer differs from the prior art by the inclusion of a differentiator 7 comprising a resistor 13 and a capacitor 14 connected in series across the output leads 5 and 6 of phase comparator 4. Experiments showed that the time taken for the frequency synthesizer to switch to an adjacent channel was significantly reduced by a charge absorbing effect of the differentiator 7.

Figure 4A:
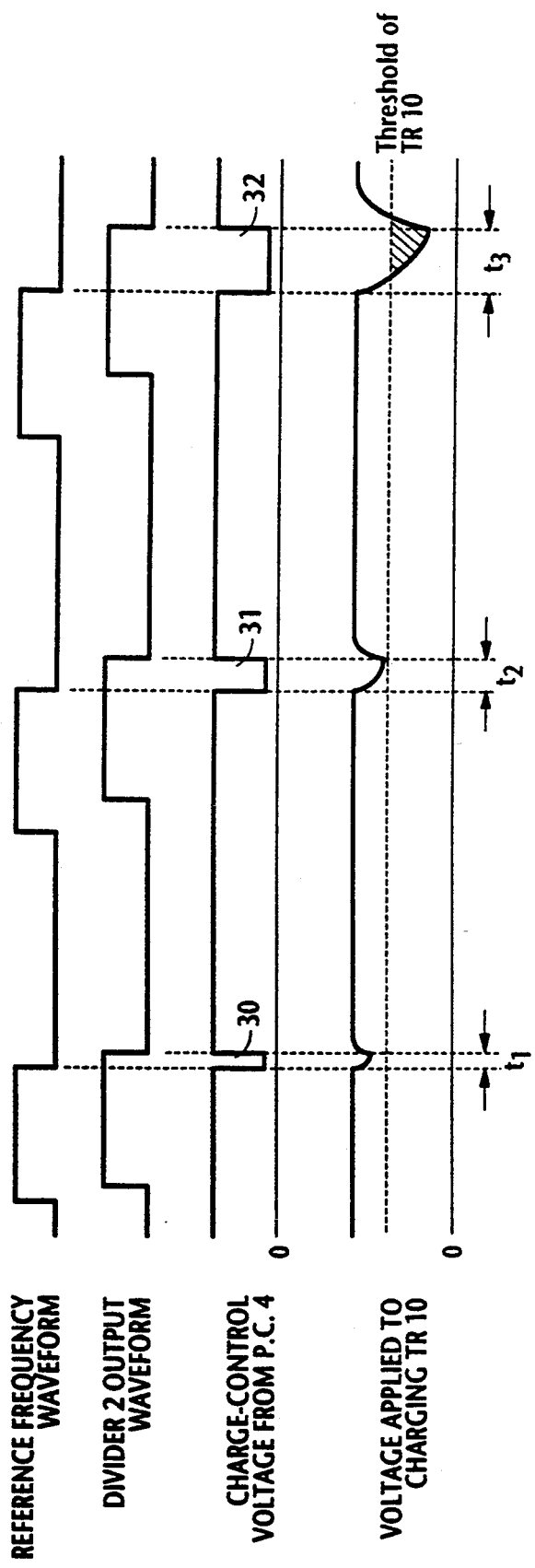
FIGS. 4A and 4B are timing diagrams associated with the frequency synthesizer of this invention.

Assume that a channel switching signal is supplied to the synthesizer to cause it to be switched to a higher-frequency adjacent channel. Because of the relatively small difference in frequency between adjacent channels, a relatively small phase lag $t_1$ is likely to occur between the reference frequency and the frequency divider 2 output immediately at a first phase comparison as shown in FIG. 4A. The charge-control voltage on lead 5 drops to a low level for a duration $t_1$, producing a small duty-ratio pulse 30. Part of the energy of pulse 30 is absorbed by integrator 8 and the remainder is applied to differentiator 7 in which it is differentiated, producing narrow spike currents at the leading and trailing edges of the pulse 30, these spike currents being injected into integrator 9 and completely absorbed. Thus, the discharging transistor 11 is not adversely affected by the spike currents from differentiator 7. Therefore, differentiator 7 has the effect of absorbing part of the energy of the charge-control signal applied to the integrator 8. As a result, the amount of energy lost during time $t_1$ is reduced in comparison with the prior art. Due to the energy absorbing effect of differentiator 7, the phase of the loop tends to drift away from the reference phase at each phase comparison. Thus, at a second phase comparison a greater phase difference $t_2$ develops. As a result, a longer duration pulse 31 is supplied from phase comparator 4 producing a charging voltage which is slightly higher than the threshold of transistor 10. Transistor 10 is still not turned on, and the drift tendency of the phase-lock loop continues. Therefore, a third pulse 32 with duration $t_3$ longer than the previous pulses is produced at a third phase comparison. Transistor 10 is sufficiently driven into conduction to charge the loop filter 12 to produce a phase advance which will result in a phase match at the next phase comparison.

Figure 4B:
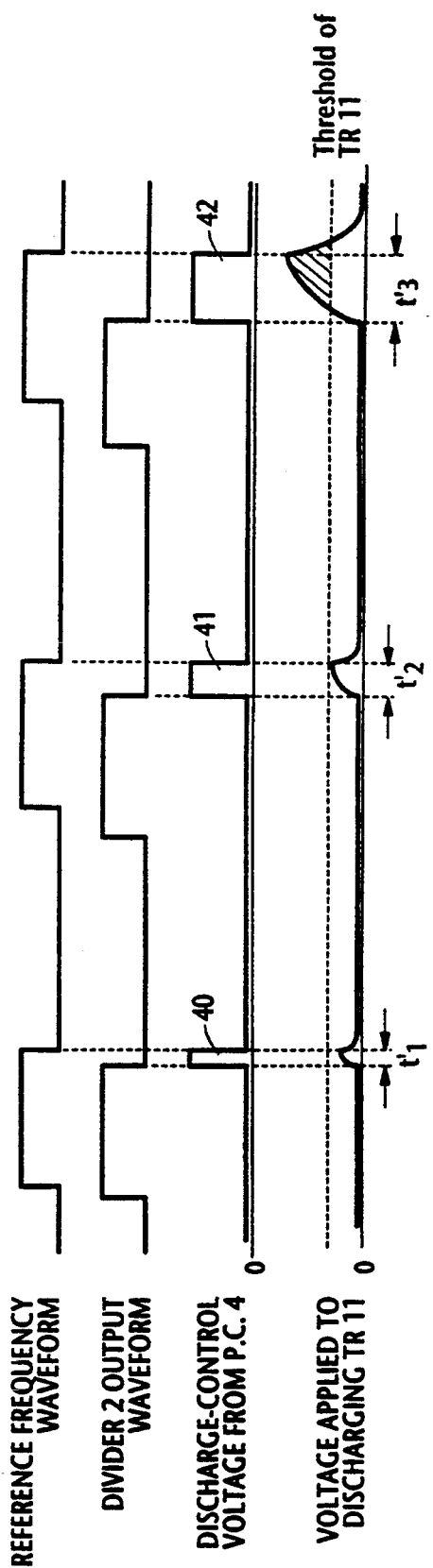

If the synthesizer is switched to a lower-frequency adjacent channel, a phase advance $t'_1$ is likely to occur at a first comparison as shown in FIG. 4B. The discharge-control voltage on lead 6 rises to a higher level for a duration $t'_1$, producing a small duty-ratio pulse 40. Part of the energy of pulse 40 is absorbed by integrator 9 and the remainder is applied to differentiator 7 in which it is differentiated, producing narrow spike currents which are injected into integrator 8 and completely absorbed. Thus, the discharging transistor 11 is not adversely affected by the spike currents from differentiator 7. Therefore, differentiator 7 has the effect of absorbing part of the energy of the discharge-control signal applied to to the integrator 9. Due to the energy absorbing effect of differentiator 7, a greater phase difference $t'_2$ develops at a second phase comparison and a longer duration pulse 41 is supplied from phase comparator 4 producing a discharging voltage which is slightly lower than the threshold of transistor 11. Transistor 11 is still not turned on and the drift tendency of the loop continues. A third pulse 42 with duration $t'_3$ longer than the previous pulses is thus generated at a third phase comparison to turn on the transistor 11 sufficiently to discharge energy from the charge pump to produce a phase lag which will result in a phase match at the next phase comparison.

What is claimed is:

1. A frequency synthesizer for communication channels, comprising:
    a voltage controlled oscillator to produce a frequency signal;
    a variable frequency divider for dividing the frequency of said frequency signal according to the frequency of one of said communication channels to produce a divided-frequency signal;
    an oscillator for generating a reference frequency signal;
    a phase comparator for detecting a phase difference of first polarity and a phase difference of second polarity between the divided-frequency signal and said reference frequency signal and producing a charge-control signal across output terminals thereof with a duration variable as a function of the phase difference of first polarity and a discharge-control signal across said output terminals with a duration variable as a function of the phase difference of second polarity;
    first and second integrator connected respectively to the output terminals of said phase comparator for respectively smoothing waveforms of said charge-control signal and said discharge-control signal;
    a charge pump arranged to be charged in response to the smoothed waveform of the charge-control signal and arranged to discharge energy in response to the smoothed waveform of the discharge-control signal to produce a frequency control voltage, said charge pump applying the frequency control voltage to said voltage controlled oscillator; and
    a differentiator coupled across the output terminals of said phase comparator for absorbing part of energy of said charge-control signal applied to said first integrator and part of energy of said discharge-control signal applied to said second integrator.

2. A frequency synthesizer as claimed in claim 1, wherein said charge pump comprises:
    a loop filter having an input connected to a circuit junction for supplying said frequency control voltage to said voltage controlled oscillator; and
    first and second transistors coupled in series between different potentials to form said circuit junction therebetween, the first transistor being of a first conductivity type and responsive to the smoothing waveform of the charge-control signal for injecting energy from said circuit junction to said loop filter, and the second transistor being of opposite conductivity type to said first conductivity type and responsive to the smoothed waveform of the discharge-control signal for draining energy from said loop filter to said circuit junction.

* * * * *